US012638773B2

(12) United States Patent
Huli et al.

(10) Patent No.: US 12,638,773 B2
(45) Date of Patent: May 26, 2026

(54) METHOD OF PREVENTING PATTERN COLLAPSE

(71) Applicant: Tokyo Electron Limited, Tokyo (JP)

(72) Inventors: Lior Huli, Albany, NY (US); Eric Chih-Fang Liu, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 391 days.

(21) Appl. No.: 18/347,634

(22) Filed: Jul. 6, 2023

(65) Prior Publication Data

US 2025/0013153 A1 Jan. 9, 2025

(51) Int. Cl.
| | |
|---|---|
| *G03F 7/11* | (2006.01) |
| *G03F 7/20* | (2006.01) |
| *H10P 50/00* | (2026.01) |
| *H10P 76/40* | (2026.01) |
| *H10P 95/00* | (2026.01) |

(52) U.S. Cl.
CPC .............. *G03F 7/11* (2013.01); *G03F 7/2004* (2013.01); *H10P 50/71* (2026.01); *H10P 50/73* (2026.01); *H10P 76/4085* (2026.01); *H10P 95/08* (2026.01)

(58) Field of Classification Search
CPC ...... G03F 7/11; G03F 7/2004; G03F 7/70033; H10P 50/60; H10P 50/71; H10P 50/73; H10P 76/2041; H10P 76/4085; H10P 95/08; H01L 21/306–3088; H01L 21/31058; H01L 21/31144; H01L 21/32139; H01L 21/31138; H01L 21/027–0338
See application file for complete search history.

(56) References Cited

U.S. PATENT DOCUMENTS

| | | | |
|---|---|---|---|
| 7,967,997 | B2 | 6/2011 | Lee |
| 8,288,289 | B2 | 10/2012 | Jeong et al. |
| 9,437,431 | B2 | 9/2016 | Trefonas, III et al. |
| 11,476,108 | B2 * | 10/2022 | Huang ................. G03F 7/0752 |
| 2009/0047788 | A1 | 2/2009 | Jung |
| 2014/0256146 | A1 * | 9/2014 | Chien ................. H01L 21/3086 438/703 |
| 2015/0323871 | A1 * | 11/2015 | Klipp ...................... G03F 7/405 510/176 |
| 2018/0247823 | A1 * | 8/2018 | LaBrake ........... H01L 21/31051 |
| 2019/0189428 | A1 * | 6/2019 | De Silva ........... H01L 21/32139 |
| 2020/0066536 | A1 * | 2/2020 | Yaegashi .................. G03F 7/11 |

(Continued)

FOREIGN PATENT DOCUMENTS

| | | |
|---|---|---|
| JP | 2008-193015 A | 8/2008 |

OTHER PUBLICATIONS

International Search Report and Written Opinion issued Oct. 4, 2024, in PCT/US2024/033310, citing documents 1-5 and 15 therein, 9 pages.

*Primary Examiner* — Christine S. Kim
*Assistant Examiner* — Tien Tran
(74) *Attorney, Agent, or Firm* — Oblon, McClelland, Maier & Neustadt, L.L.P.

(57) ABSTRACT

A method of microfabrication includes forming a sacrificial layer over a film. A resist layer is formed over the sacrificial layer. The resist layer includes an extreme ultraviolet (EUV) resist. A pattern is formed in the resist layer by an EUV exposure and a wet etch followed by rinsing and drying, resulting in uncovered portions of the sacrificial layer. The uncovered portions of the sacrificial layer are treated. The pattern is transferred from the resist layer to the film by performing an etch process.

19 Claims, 9 Drawing Sheets

(56) References Cited

U.S. PATENT DOCUMENTS

| | | | |
|---|---|---|---|
| 2020/0272045 A1* | 8/2020 | Felix ........................ | G03F 7/094 |
| 2021/0407804 A1* | 12/2021 | Ko .......................... | G03F 7/091 |
| 2022/0037152 A1* | 2/2022 | Raley ................ | H01L 21/31116 |
| 2023/0103089 A1* | 3/2023 | Choi .................... | C07D 251/32 |
| | | | 430/326 |
| 2024/0063019 A1* | 2/2024 | Krawicz ........... | H01L 21/31138 |

* cited by examiner

METHOD OF PREVENTING PATTERN COLLAPSE

FIELD OF THE INVENTION

This disclosure relates generally to methods of microfabrication and more specifically to lithography and patterning.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Particularly, in material processing methodologies (such as photolithography), creating patterned layers includes the application of a thin layer of radiation-sensitive material, such as a photoresist, to a working surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photo-lithography system such as a scanner or stepper tool. This exposure can then be followed by the removal of irradiated regions of the radiation-sensitive material or non-irradiated regions using a developing solvent depending on a photoresist tone and developer tone. This mask layer may include multiple sub-layers.

SUMMARY

The present disclosure relates to methods of microfabrication, particularly lithography and patterning.

According to a first aspect of the disclosure, a method of microfabrication is provided. The method includes forming a sacrificial layer over a film. A resist layer is formed over the sacrificial layer. The resist layer includes an extreme ultraviolet (EUV) resist. A pattern is formed in the resist layer by an EUV exposure and a wet etch followed by rinsing and drying, resulting in uncovered portions of the sacrificial layer. The uncovered portions of the sacrificial layer are treated. The pattern is transferred from the resist layer to the film by performing an etch process.

In some embodiments, the resist layer is formed to have a thickness below a threshold thickness above which a patterned layer of the EUV resist collapses during the rinsing and the drying.

In some embodiments, the threshold thickness is determined by forming the patterned layer of the EUV resist over and in direct contact with the film, which includes the wet etch followed by the rinsing and the drying. Whether the EUV resist has collapsed after the rinsing and the drying is determined.

In some embodiments, treating the uncovered portions of the sacrificial layer includes removing the uncovered portions of the sacrificial layer, resulting in uncovered portions of the film.

In some embodiments, after removing the uncovered portions of the sacrificial layer to increase a total pattern height of the pattern above the film, the etch process is performed to remove the uncovered portions of the film.

In some embodiments, treating the uncovered portions of the sacrificial layer includes increasing an etch rate of the uncovered portions of the sacrificial layer for the etch process.

In some embodiments, the etch process is configured to etch the uncovered portions of the sacrificial layer and then the film.

In some embodiments, treating the uncovered portions of the sacrificial layer includes performing at least one treatment selected from the group consisting of ultraviolet light (UV), ashering, plasma and heat.

In some embodiments, the at least one treatment is configured to change a chemical composition or a material structure of the uncovered portions of the sacrificial layer.

In some embodiments, the resist layer is not responsive to the at least one treatment.

In some embodiments, the sacrificial layer includes a material selected from the group consisting of an organic spin-on material and a UV photoresist.

In some embodiments, the organic spin-on material includes a spin-on carbon.

In some embodiments, the sacrificial layer is selected such that the resist layer has a stronger adhesion to the sacrificial layer than to the film.

In some embodiments, the sacrificial layer is configured to be etch-resistant to the etch process, relative to the film.

In some embodiments, the sacrificial layer has a higher Young's modulus than the resist layer.

In some embodiments, the pattern has a pitch of 30 nm or less.

According to a second aspect of the disclosure, a method of microfabrication is provided. The method includes forming a sacrificial layer over a film. A resist layer is formed over the sacrificial layer. The resist layer includes an extreme ultraviolet (EUV) resist. A pattern is formed in the resist layer by an EUV exposure and a wet etch followed by rinsing and drying, resulting in uncovered portions of the sacrificial layer. The uncovered portions of the sacrificial layer are removed, resulting in uncovered portions of the film and an increased total height of the pattern above the film. The uncovered portions of the film are removed to transfer the pattern from the resist layer to the film using the resist layer and the sacrificial layer as a combined etch mask.

In some embodiments, the resist layer is formed to have a first thickness below a threshold thickness above which a patterned layer of the EUV resist collapses during the rinsing and the drying. The sacrificial layer is formed to have a second thickness such that the increased total height of the pattern is sufficient for transferring the pattern from the resist layer to the film.

In some embodiments, the sacrificial layer includes a spin-on carbon.

According to a third aspect of the disclosure, a method of microfabrication is provided. The method includes forming a sacrificial layer over a film. A resist layer is formed over the sacrificial layer. The resist layer includes an extreme ultraviolet (EUV) resist. A pattern is formed in the resist layer by an EUV exposure and a wet etch followed by rinsing and drying, resulting in uncovered portions of the sacrificial layer. The uncovered portions of the sacrificial layer are treated using the pattern as a mask to increase an etch rate of the uncovered portions of the sacrificial layer for a continuous etch process. The pattern is transferred from the resist layer to the film by executing the continuous etch process to etch the uncovered portions of the sacrificial layer and then the film.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 2A, 2B, 2C, 2D, 2E, 2F and 2G show cross-sectional views of a semiconductor device at various intermediate steps of manufacturing, in accordance with some embodiments of the present disclosure.

DETAILED DESCRIPTION

Figure 1:
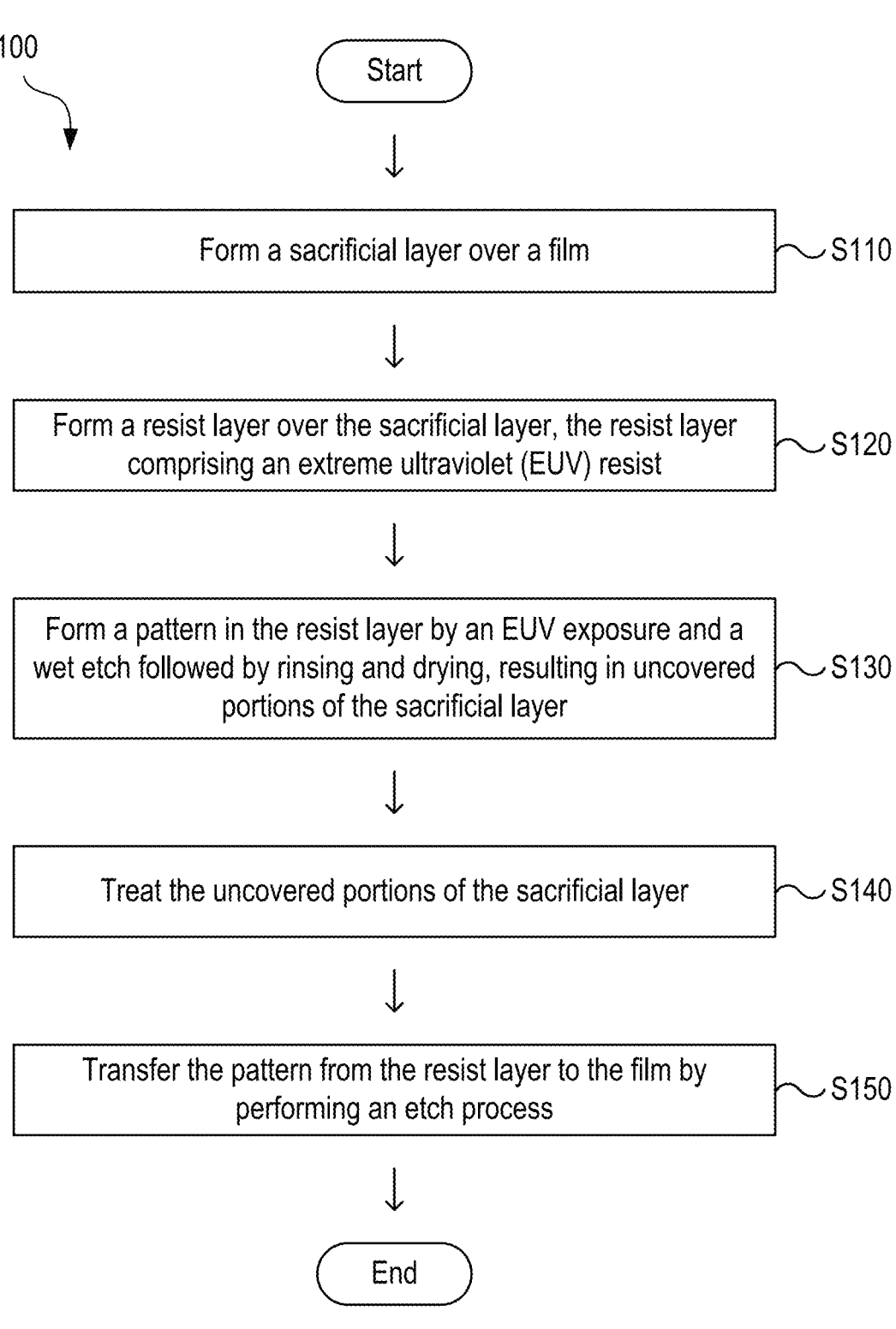
FIG. 1 shows a flow chart of a process of microfabrication, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

Conventional lithographic techniques for exposing a pattern of radiation or light onto a substrate have various challenges that limit a size of features exposed, and limit pitch or spacing between exposed features. One technology to extend lithographic patterning to smaller dimensions is extreme ultraviolet (EUV) lithography (EUVL), which is a candidate for a cost-friendly process to enable next-generation devices. However, EUVL has had many challenges that keep it from being used extensively in high volume manufacturing, especially in the sub 30 nm domain.

One of the main challenges in current EUVL is pattern collapse, particularly for traditional EUV resist wet development methods. Pattern collapse is the damage induced by capillary forces from various solution-based processes executed during microfabrication and becomes severe at sub 30 nm pitch, which will be a main issue for high numerical aperture (NA) EUV processes. Another critical problem is limited ability to transfer the resist feature by an etch process to the underlying layer due to the reduction in resist thickness to achieve a low aspect ratio, which is one of the main solutions to overcome pattern collapse. "Aspect ratio" is a term used to describe dimensions of resist CD (e.g. width) to resist height, expressed in a ratio form. The reduction in the resist thickness to achieve a low aspect ratio limits the ability to fully transfer the resist feature into the subsequent underlying layer by an etch process.

Pattern collapse can be caused by the capillary force between resist patterns during wet processes, such as rinsing and drying in resist development. Of particular interest regarding the capillary force, are the surface tension and the contact angle of the rinsing liquid as well as the pattern structure (e.g. pattern shape, line width, space width, height and aspect ratio). Pattern collapse occurs when the surface tension induced by the rinsing liquid exceeds the adhesion force between the resist material and an underlying layer (e.g. a metal film, a dielectric film or a substrate).

For example in a conventional wet development process, a wet developer is used to develop a resist film. At the end of the development process, a deionized (DI) water rinse is typically performed to quench or stop the reaction of the wet developer. Then, a high-speed spin is usually performed to remove the DI water from the wafer. As the DI water dries, tensile stress is created between two adjacent resist shapes (e.g. two photoresist lines), which can be strong enough to pull the lines together, thus causing the lines to collapse. The wafer can alternatively be rinsed with DI water and then air-dried, during which process, surface tension from receding water can pull on and bend the top of the resist shapes to induce line collapse. Additionally, in some examples, the DI water rinse is not the last rinse process. An organic solvent, such as isopropyl alcohol (IPA), may be used as the last, drying liquid.

Figure 6A:
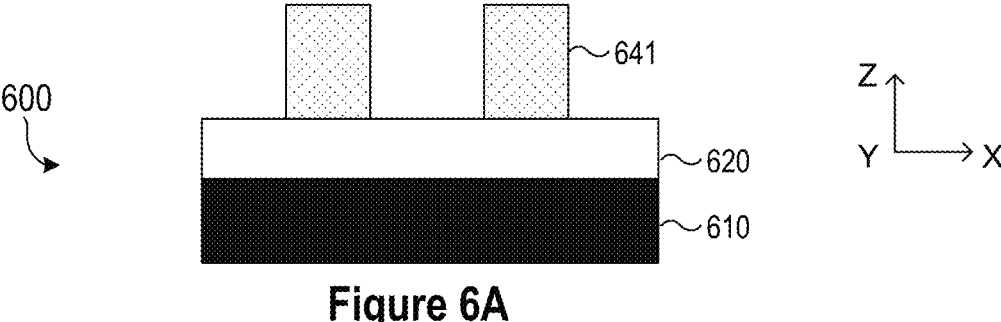
FIGS. 6A, 6B and 6C show cross-sectional views of a semiconductor device at various intermediate steps of conventional manufacturing.
Figure 6B:
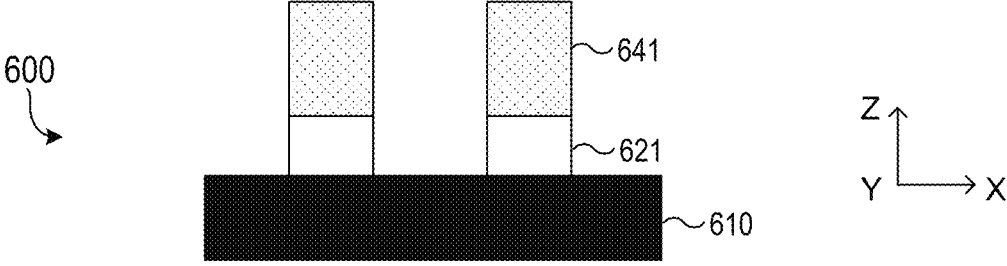

FIGS. 6A and 6B show cross-sectional views of a semiconductor device 600 at two intermediate steps of conventional manufacturing. In FIG. 6A, the semiconductor device 600 includes a substrate 610 and a film 620 to be patterned. A patterned resist layer (e.g. 641) is formed over the film 620. The pattern 641 may suffer from line collapse and/or a relatively small film thickness, as discussed earlier. In FIG. 6B, the patterned resist layer (e.g. 641) is used as an etch mask to transfer a pattern from the patterned resist layer (e.g. 641) to the film 620.

Figure 6C:
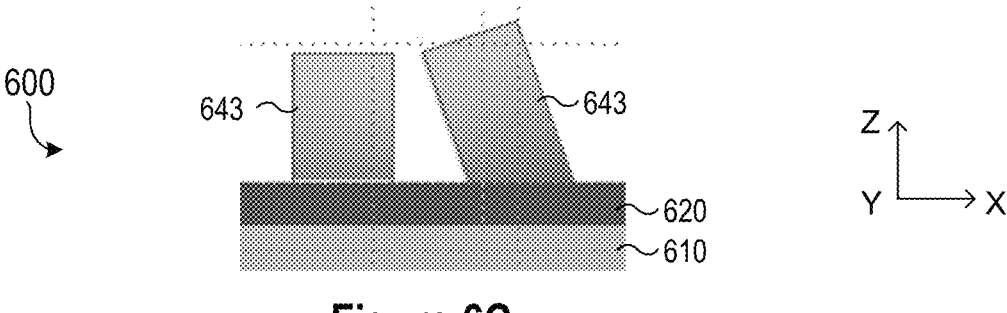

Note that FIGS. 6A and 6B show ideal, desired results, which are often elusive in practice, especially when a pitch of the pattern is below 30 nm. FIG. 6C illustrates an example of pattern collapse in reality for conventional manufacturing. Herein, a line pattern 643 of resist is formed over the film 620. However, the line pattern 643 has collapsed on the film 620, for example due to the rinsing and drying processes as discussed above.

Figures 7A, 7B, 7C:
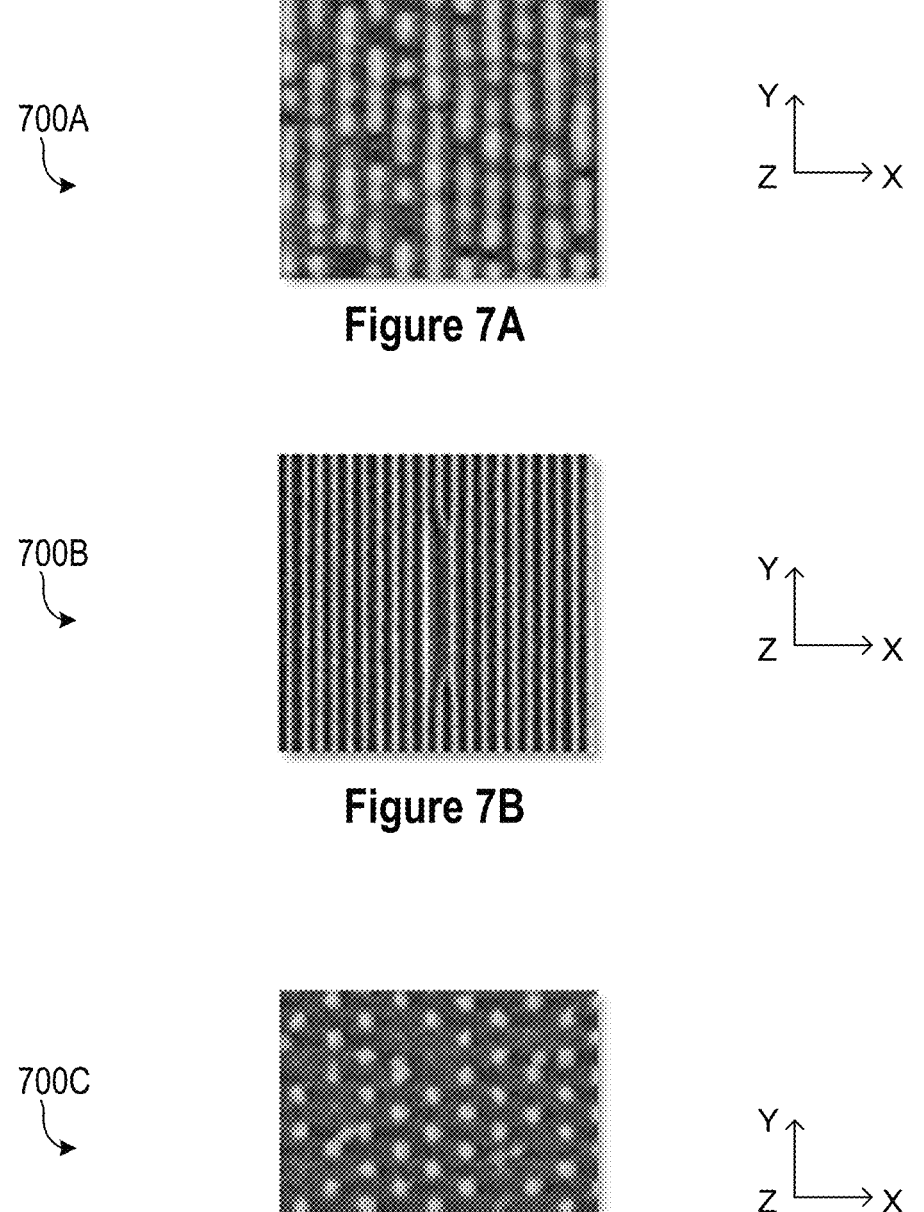
FIGS. 7A, 7B and 7C shows top-down views of semiconductor devices in conventional manufacturing.

FIGS. 7A, 7B and 7C shows top-down views of semiconductor devices in conventional manufacturing. FIG. 7A shows an example of resist damage during etching when the resist thickness is too small (e.g. a thin resist layer). FIG. 7B shows an example of resist line collapse when the resist thickness is too big (e.g. a thick resist layer). FIG. 7C shows an example of resist pillar collapse when the resist thickness is too big (e.g. a thick resist layer).

Aspects of the present disclosure are related to a method of microfabrication. A sacrificial layer is formed over a film, and a resist layer is formed over the sacrificial layer. The resist layer includes an extreme ultraviolet (EUV) resist. A pattern is formed in the resist layer by an EUV exposure and a wet etch followed by rinsing and drying, which results in uncovered portions of the sacrificial layer. The uncovered portions of the sacrificial layer are then treated. The pattern is transferred from the resist layer to the film by performing an etch process.

Techniques herein utilize a sacrificial underlayer (or a standard underlying material) with a new film treatment process to increase the etch durability while maintaining a low aspect ratio (e.g. a ratio of resist thickness to resist critical dimension (CD)) allow standard wet development for future pitch scaling devices. The sacrificial underlayer can be used to increase a total pattern height (e.g. a total mask thickness) while reducing the resist thickness. As a result, etch durability of resist feature CD can be improved while continuing to decrease resist thickness to maintain a low aspect ratio that is required to avoid pattern collapse. Pattern collapse can be prevented, while improving etch durability, without sacrificing lithography performance. Traditional clean-track wet development can be extended to sub 30 nm pitches and high NA EUV. Techniques herein provide a pathway to enable a low aspect ratio with sufficient etch transfer.

FIG. 1 shows a flow chart of a process 100 of microfabrication, in accordance with some embodiments of the present disclosure. The process 100 starts with Step S110 by forming a sacrificial layer over a film. At Step S120, a resist layer is formed over the sacrificial layer. The resist layer includes an extreme ultraviolet (EUV) resist. At Step S130, a pattern is formed in the resist layer by an EUV exposure and a wet etch followed by rinsing and drying, resulting in uncovered portions of the sacrificial layer. At Step S140, the uncovered portions of the sacrificial layer are treated. At Step S150, the pattern is transferred from the resist layer to the film by performing an etch process.

FIGS. 2A, 2B, 2C, 2D, 2E, 2F and 2G show cross-sectional views of a semiconductor device 200 at various intermediate steps of manufacturing, in accordance with some embodiments of the present disclosure.

Figures 2A, 2B, 2C, 2D:
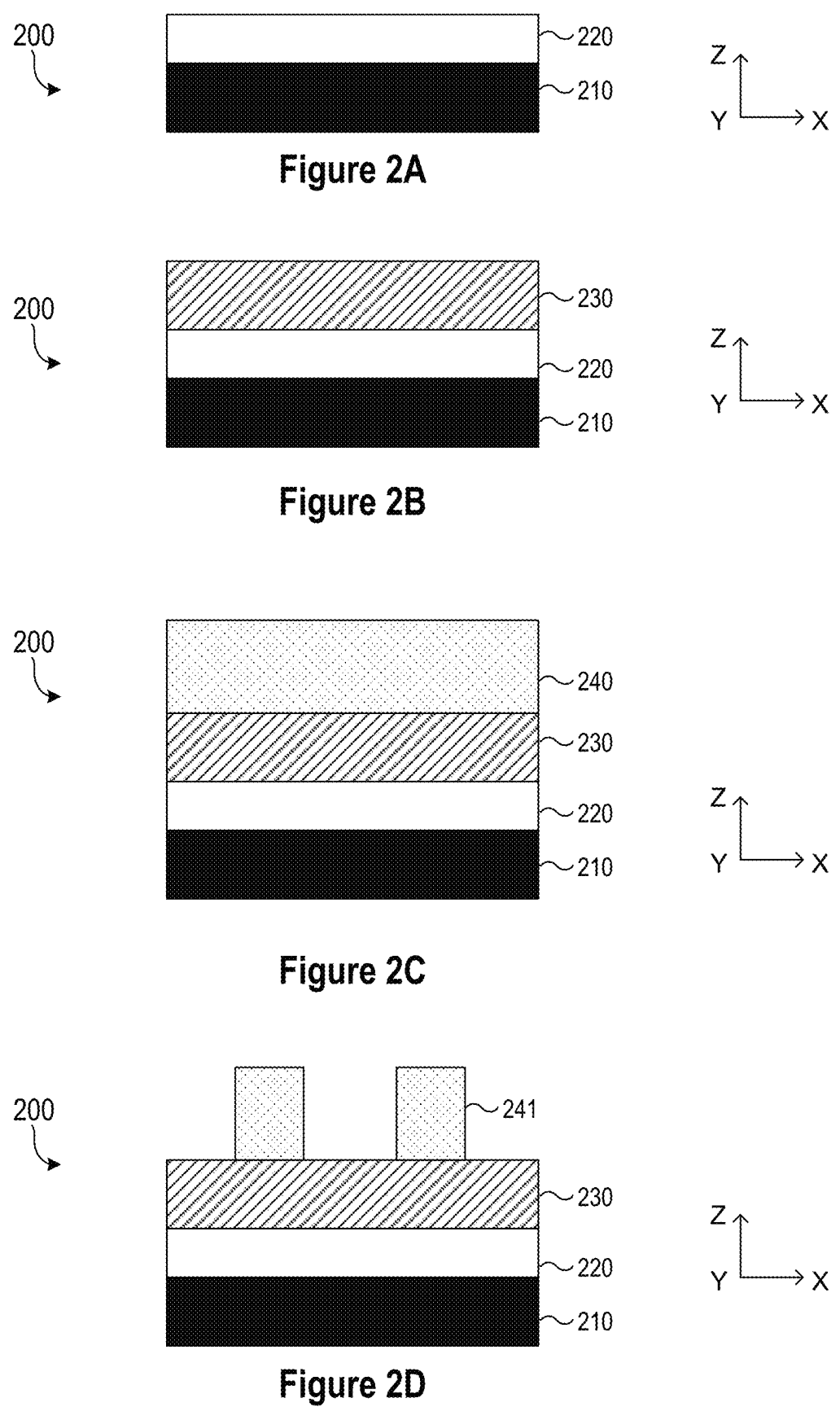

In FIG. 2A, a film 220 is formed over a substrate 210. The film 220 is not limited to any specific material and can for example include a metal and/or a dielectric to be patterned. The film 220 can be formed by wet deposition (e.g. spin coating) or dry deposition (e.g. vapor deposition). The vapor deposition can include, but is not limited to, chemical vapor deposition, physical vapor deposition, atomic layer deposition (ALD), epitaxial growth (e.g. molecular beam epitaxy) and the like.

In FIG. 2B, a sacrificial layer 230 is formed over the film 220. The sacrificial layer 230 can be formed by wet deposition (e.g. a spin-on organic material) or dry deposition (e.g. ALD).

In FIG. 2C, a resist layer 240 is formed over the sacrificial layer 230. The resist layer 240 can include an extreme ultraviolet (EUV) resist. In one embodiment, the resist layer 240 includes a wet resist formed by spin-on deposition. In another embodiment, the resist layer 240 includes a dry resist formed by dry deposition. Both wet and dry EUV resist typically include a metal or metal oxide.

In FIG. 2D, the resist layer 240 can subsequently be exposed to a pattern of EUV radiation. Solubility-shifting agents within the resist layer 240 can then cause a shift or change in solubility (or developability) in response to an exposure to EUV radiation. The solubility change can be either from insoluble to soluble (this embodiment), or from soluble to insoluble (another embodiment, not shown here) depending on tone of resist and developer used. Development covers any technique to develop or remove a portion of the resist layer 240. Herein, a developer (liquid) is used to dissolve either the exposed EUV resist (this embodiment) or dissolve the unexposed EUV resist (another embodiment, not shown here). Developing the EUV resist results in a pattern 241 that uncovers portions of the sacrificial layer 230. While not shown, the semiconductor device 200 can be rinsed, for example by DI water or an organic solvent (e.g. isopropyl alcohol (IPA)), at the end of the development process.

Figure 2E:
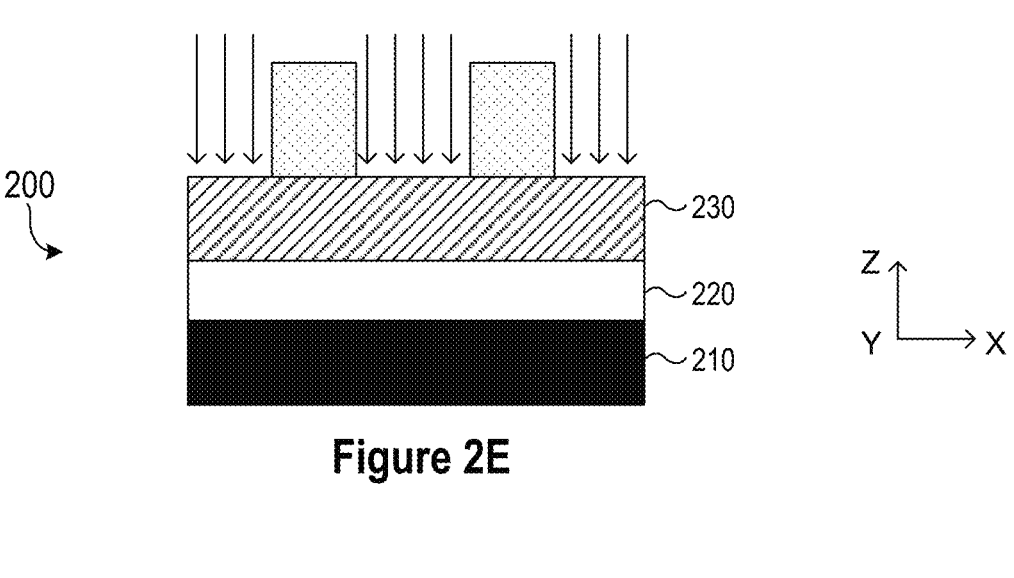

In FIG. 2E, the uncovered portions of the sacrificial layer 230 are treated, using the pattern 241 as a mask, with at least one treatment selected from the group consisting of ultraviolet light (UV), ashing, plasma and heat (e.g. thermal treatment). The at least one treatment is represented by arrows. In this example, the at least one treatment includes removing the uncovered portions of the sacrificial layer 230 by UV in air.

Figure 2F:
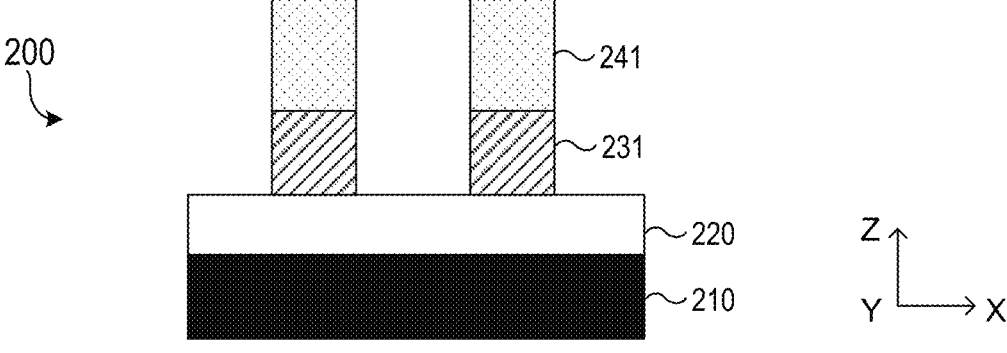

As a result, in FIG. 2F, the uncovered portions of the sacrificial layer 230 are removed to uncover portions of the film 220. The pattern 241 is transferred into the sacrificial layer 230 to form a pattern 231 therein, and a total pattern height of the pattern (e.g. 241+231) is increased above the film 220.

Figure 2G:
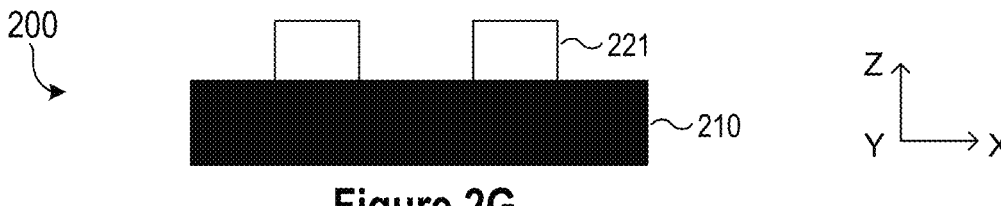

In FIG. 2G, the pattern 241 is transferred from the resist layer 240 to the film 220 by performing an etch process. The patterns 231 and 241 are removed.

In comparison to conventional manufacturing (e.g. FIGS. 6A and 6B), techniques shown in FIGS. 2A-2G have various advantages. For example, the total pattern height of the pattern (e.g. 241+231) is increased above the film 220 in FIG. 2F before the etch process of the film 220. Therefore, the height (or thickness) of the pattern 241 in FIG. 2D can be reduced compared with the height (or thickness) of the pattern 641 in FIG. 6A, thus effectively avoiding pattern collapse.

In some embodiments, the resist layer 240 is formed to have a thickness below a threshold thickness above which a patterned layer of the EUV resist collapses during the rinsing and/or drying. The threshold thickness can be determined beforehand, for example by forming a patterned layer of the EUV resist over and in direct contact with the film 220, which includes a wet development followed by the rinsing and/or drying, and determining whether the EUV resist has collapsed after the rinsing and/or drying. That is, the process in FIG. 6A can be executed repeatedly with a series of heights (or film thicknesses) of the pattern 641, to obtain the threshold thickness. Alternatively, the threshold thickness can be obtained by analyzing historical data of pattern collapse. The threshold thickness does not have to be accurate and can be a rough estimate. The goal is to form the resist layer 240 so that the pattern 241 will not collapse during processing. Note that this approach may not be applicable to conventional manufacturing (e.g. FIGS. 6A and 6B) because when the thickness of the resist layer or the height of the pattern 641 is too small, pattern transfer may be limited due to resist damage during etching (e.g. FIG. 7A).

Additionally, the sacrificial layer 230 can be designed from various perspectives to improve pattern transfer as well as suppress pattern collapse. For instance, the sacrificial layer 230 can be selected such that the resist layer 240 has a stronger adhesion to the sacrificial layer 230 than to the film 220, which helps secure or fasten bottoms of the pattern 241 and thus suppress pattern collapse.

The sacrificial layer 230 can be configured to be etch-resistant to the etch process, relative to the film 220 and/or the resist layer 240, which improves pattern transfer despite a thin resist layer (e.g. 240). The sacrificial layer 230 can be formed to have a thickness such that the increased total height of the pattern (e.g. 231+241) is sufficient for transferring the pattern 241 from the resist layer 240 to the film 220.

The sacrificial layer 230 can have a higher Young's modulus than the resist layer 240. Young's modulus is a measure of stiffness. In other words, the sacrificial layer 230 can be stiffer than the resist layer 240, which suppresses pattern collapse.

The sacrificial layer 230 can have a water contact angle of 45-85°, which can reduce surface tension and thus suppress pattern collapse. A water contact angle of zero (that is, very hydrophilic) leads to the maximum force pulling resist lines towards each other, whereas a water contact angle of 180° causes the maximum force pushing resist lines away from each other. In either case, such pulling or pushing force can result in pattern collapse. Meanwhile, adhesion between the sacrificial layer 230 and the resist layer 240 is also related to the water contact angle of the sacrificial layer 230 and is usually optimum between 45° and 85°. Therefore, surface tension (or pulling/pushing force) can be reduced when sacrificial layer 230 has a water contact angle of 45-85°, preferably 50-80°, preferably 55-75°, preferably 60-70°, preferably about 65°. As discussed earlier, in some embodiments, an organic solvent, such as isopropyl alcohol (IPA), may be used as the last, drying liquid instead of water. The contact angle analysis above is also applicable to the organic solvent.

Figure 3:
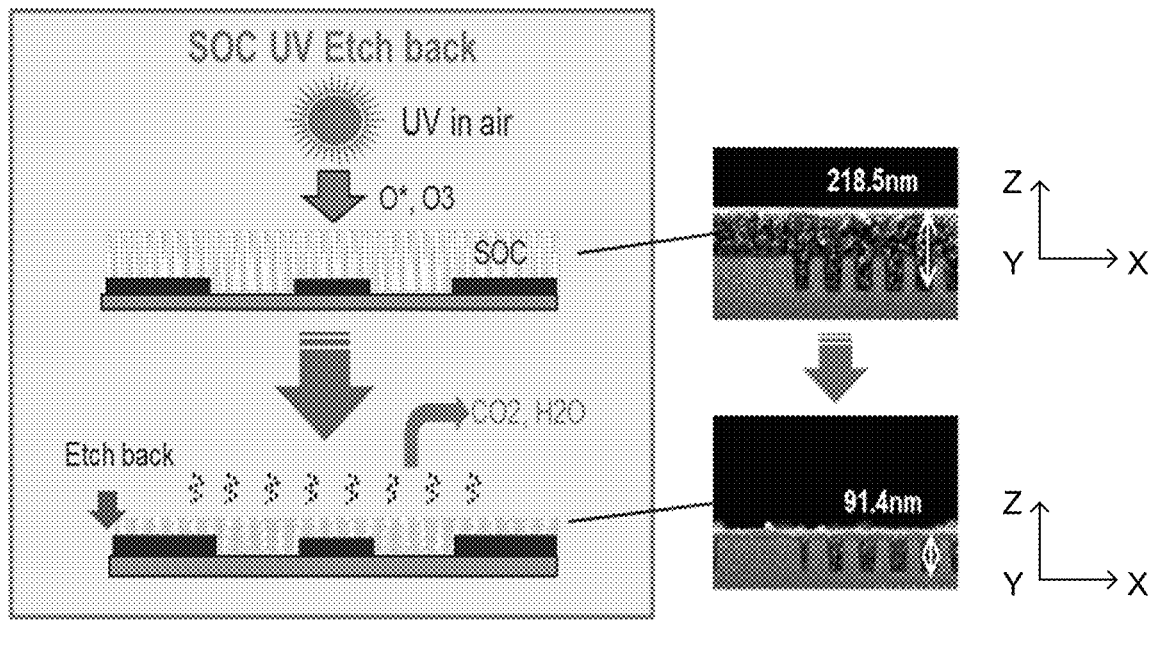
FIG. 3 shows cross-sectional views of a semiconductor device at various intermediate steps of manufacturing, in accordance with some embodiments of the present disclosure.

In one embodiment, the sacrificial layer 230 includes an organic spin-on material, such as a spin-on carbon. In one embodiment, the sacrificial layer 230 includes a UV photoresist, whose solubility can be tuned by UV exposure. For example, FIG. 3 shows etching of a spin-on carbon (SOC) by UV in air.

FIGS. 4A, 4B, 4C, 4D, 4E and 4F show cross-sectional views of a semiconductor device 400 at various intermediate steps of manufacturing, in accordance with some embodiments of the present disclosure.

Figure 4A:
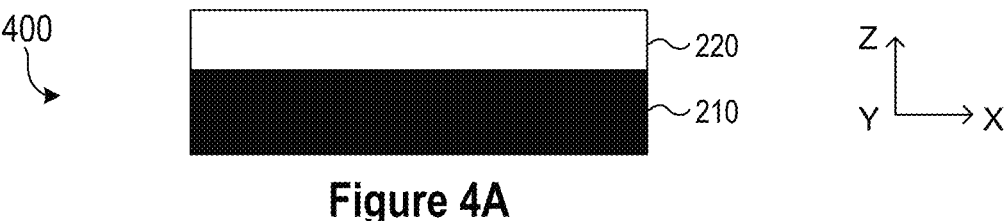
FIGS. 4A, 4B, 4C, 4D, 4E and 4F show cross-sectional views of a semiconductor device at various intermediate steps of manufacturing, in accordance with some embodiments of the present disclosure.
Figure 4B:
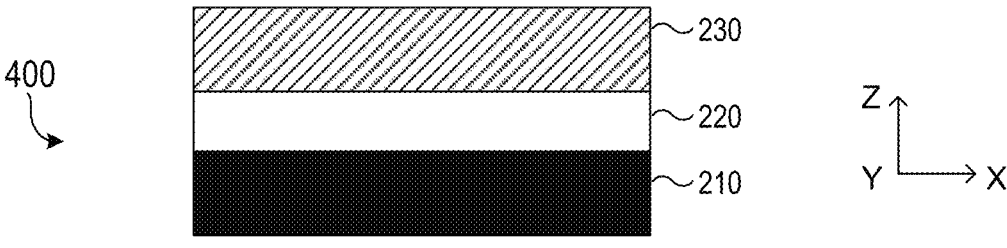
Figure 4C:
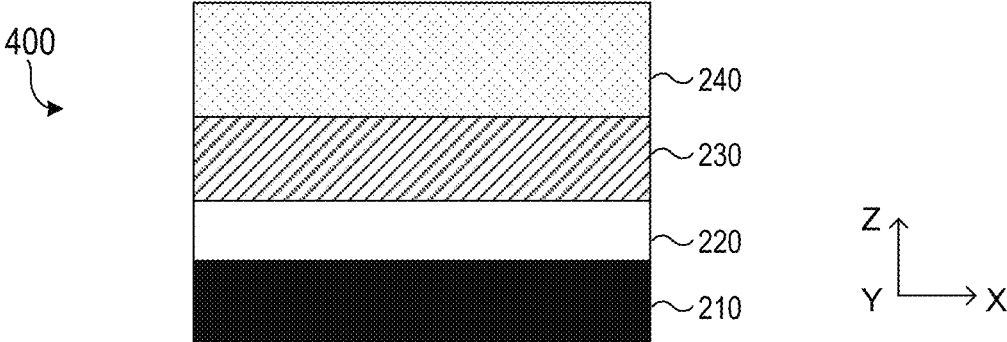
Figure 4D:
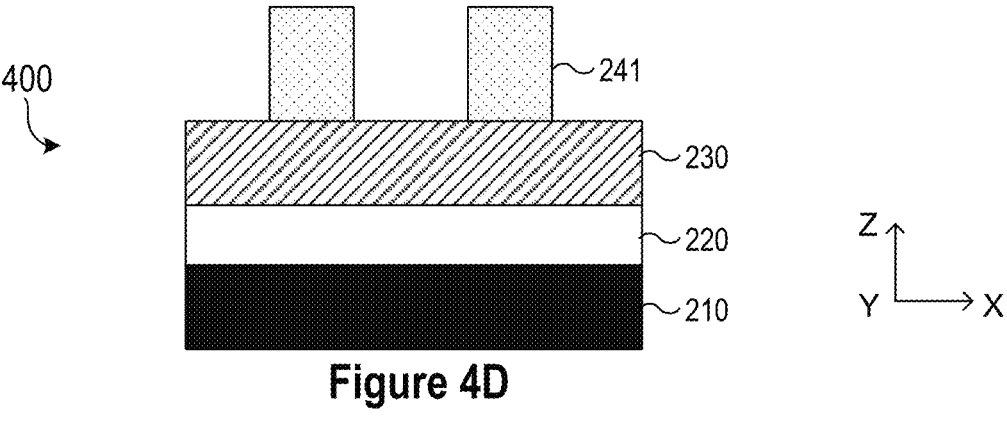

In FIG. 4A, the film 220 is formed over the substrate 210. In FIG. 4B, the sacrificial layer 230 is formed over the film 220. The sacrificial layer 230 can be formed by wet deposition (e.g. a spin-on organic material) or dry deposition (e.g. ALD). In FIG. 4C, the resist layer 240 is formed over the sacrificial layer 230. In FIG. 4D, the pattern 241 is formed in the resist layer 240, by an EUV exposure, a wet etch, rinsing and/or drying. FIGS. 4A-4D are similar to FIGS. 2A-2D.

Figure 4E:
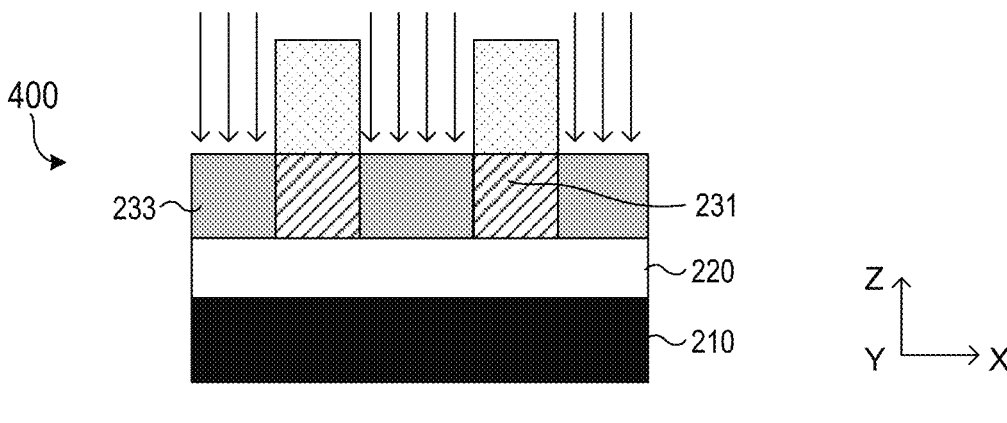

In FIG. 4E, uncovered portions 233 of the sacrificial layer 230 are treated, using the pattern 241 as a mask, with at least one treatment selected from the group consisting of ultra-violet light (UV), ashering, plasma and heat (e.g. thermal treatment). The at least one treatment is represented by arrows. In this example, the uncovered portions 233 of the sacrificial layer 230 are treated to increase an etch rate of the uncovered portions of the sacrificial layer 230, relative to covered portions (e.g. the pattern 231) of the sacrificial layer 230. For instance, the at least one treatment can change a chemical composition and/or material structure of the uncovered portions 233 of the sacrificial layer 230.

Figure 4F:
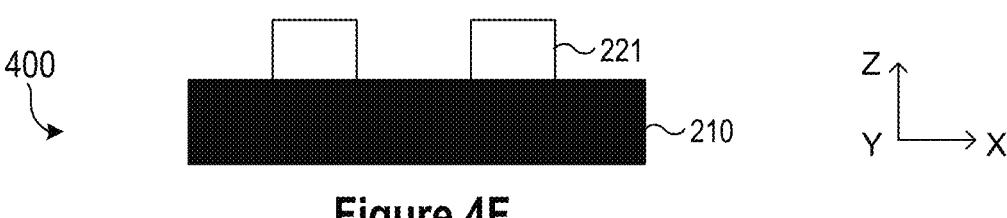

In FIG. 4F, an etch process is executed to transfer the pattern 241 from the resist layer 240 to the film 220. The patterns 231 and 241 are also removed. The etch process can be a continuous etch process that etches the uncovered portions 233 of the sacrificial layer 230 and then the film 220. The continuous etch process may use a single recipe or multiple recipes. Due to the at least one treatment in FIG. 4E, the uncovered portions 233 of the sacrificial layer 230 can be easily removed, relative to the covered portions (e.g. the pattern 231) of the sacrificial layer 230, the film 220 and/or the pattern 241.

Figure 5:
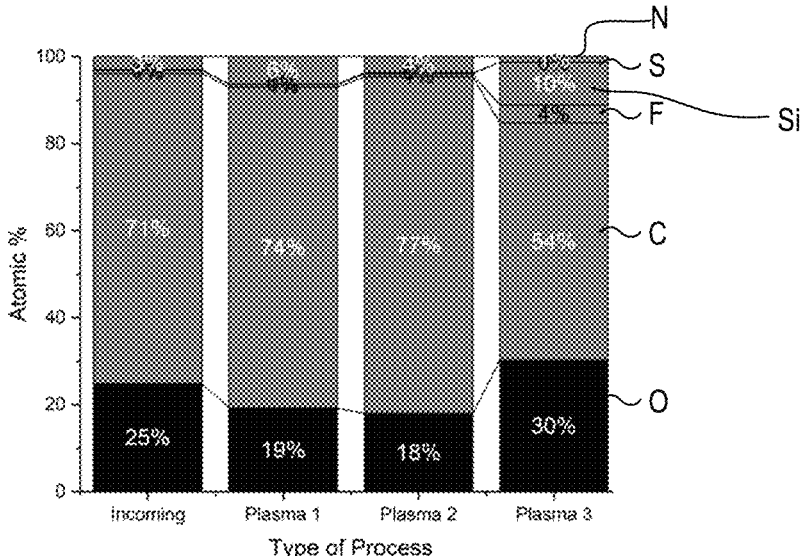
FIG. 5 shows chemical analyses at various intermediate steps of manufacturing, in accordance with some embodiments of the present disclosure.

FIG. 5 shows chemical analyses of an SOC layer at various intermediate steps of plasma treatments, in accordance with some embodiments of the present disclosure. As shown, the chemical composition of the SOC layer is changed after each plasma treatment. Consequently, the chemically modified SOC layer is etched faster than the original SOC layer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/ or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of microfabrication, the method comprising:
forming a sacrificial layer over a film;
forming a resist layer over the sacrificial layer, the resist layer comprising an extreme ultraviolet (EUV) resist;
forming a pattern in the resist layer by an EUV exposure and a wet etch followed by rinsing and drying, resulting in uncovered portions of the sacrificial layer, wherein the resist layer is formed to have a thickness below a threshold thickness above which a patterned layer of the EUV resist collapses during the rinsing and the drying;
treating the uncovered portions of the sacrificial layer;
transferring the pattern from the resist layer to the film by performing an etch process; and
determining the threshold thickness by
(a) forming the patterned layer of the EUV resist over and in direct contact with the film, which includes the wet etch followed by the rinsing and the drying,
(b) determining whether the EUV resist has collapsed after the rinsing and the drying, and
repeating (a) and (b) for a series of thicknesses of the patterned layer of the EUV resist.

2. The method of claim 1, wherein treating the uncovered portions of the sacrificial layer comprises removing the uncovered portions of the sacrificial layer, resulting in uncovered portions of the film.

3. The method of claim 2, after removing the uncovered portions of the sacrificial layer to increase a total pattern height of the pattern above the film, the method further comprising performing the etch process to remove the uncovered portions of the film.

4. The method of claim 1, wherein treating the uncovered portions of the sacrificial layer comprises increasing an etch rate of the uncovered portions of the sacrificial layer for the etch process.

5. The method of claim 4, wherein the etch process is configured to etch the uncovered portions of the sacrificial layer and then the film.

6. The method of claim 1, wherein treating the uncovered portions of the sacrificial layer comprises performing at least one treatment selected from the group consisting of ultraviolet light (UV), plasma ashing, plasma and heat.

7. The method of claim 6, wherein the at least one treatment is configured to change a chemical composition or a material structure of the uncovered portions of the sacrificial layer.

8. The method of claim 6, wherein the resist layer is not responsive to the at least one treatment.

9. The method of claim 1, wherein the sacrificial layer comprises a material selected from the group consisting of an organic spin-on material and a UV photoresist.

10. The method of claim 9, wherein the organic spin-on material includes a spin-on carbon.

11. The method of claim 1, wherein the sacrificial layer is selected such that the resist layer has a stronger adhesion to the sacrificial layer than to the film.

12. The method of claim 1, wherein the sacrificial layer is configured to be etch-resistant to the etch process, relative to the film.

13. The method of claim 1, wherein the sacrificial layer has a higher Young's modulus than the resist layer.

14. The method of claim 1, wherein the pattern has a pitch of 30 nm or less.

15. A method of microfabrication, the method comprising:
forming a sacrificial layer over a film;
forming a resist layer over the sacrificial layer, the resist layer comprising an extreme ultraviolet (EUV) resist;
forming a pattern in the resist layer by an EUV exposure and a wet etch followed by rinsing and drying, resulting in uncovered portions of the sacrificial layer, wherein the resist layer is formed to have a thickness below a threshold thickness above which a patterned layer of the EUV resist collapses during the rinsing and the drying;
removing the uncovered portions of the sacrificial layer, resulting in uncovered portions of the film and an increased total height of the pattern above the film;
removing the uncovered portions of the film to transfer the pattern from the resist layer to the film using the resist layer and the sacrificial layer as a combined etch mask; and
determining the threshold thickness by
(a) forming the patterned layer of the EUV resist over and in direct contact with the film, which includes the wet etch followed by the rinsing and the drying,
(b) determining whether the EUV resist has collapsed after the rinsing and the drying, and
repeating (a) and (b) for a series of thicknesses of the patterned layer of the EUV resist.

16. The method of claim 15, wherein:

the resist layer is formed to have a first thickness below a threshold thickness above which a patterned layer of the EUV resist collapses during the rinsing and the drying, and the sacrificial layer is formed to have a second thickness such that the increased total height of the pattern is sufficient for transferring the pattern from the resist layer to the film.

17. The method of claim 15, wherein the sacrificial layer comprises a spin-on carbon.

18. A method of microfabrication, the method comprising:

forming a sacrificial layer over a film;

forming a resist layer over the sacrificial layer, the resist layer comprising an extreme ultraviolet (EUV) resist;

forming a pattern in the resist layer by an EUV exposure and a wet etch followed by rinsing and drying, resulting in uncovered portions of the sacrificial layer, wherein the resist layer is formed to have a thickness below a threshold thickness above which a patterned layer of the EUV resist collapses during the rinsing and the drying;

treating the uncovered portions of the sacrificial layer using the pattern as a mask to increase an etch rate of the uncovered portions of the sacrificial layer for a continuous etch process;

transferring the pattern from the resist layer to the film by executing the continuous etch process to etch the uncovered portions of the sacrificial layer and then the film; and determining the threshold thickness by (a) forming the patterned layer of the EUV resist over and in direct contact with the film, which includes the wet etch followed by the rinsing and the drying, (b) determining whether the EUV resist has collapsed after the rinsing and the drying, and repeating (a) and (b) for a series of thicknesses of the patterned layer of the EUV resist.

19. The method of claim 1, wherein the sacrificial layer has a water contact angle of 45-85°.

* * * * *